United States Patent [19]

Dutt et al.

[11] Patent Number: 5,229,231
[45] Date of Patent: Jul. 20, 1993

[54] METHOD OF INTEGRATED CIRCUIT MANUFACTURING INCLUDING CELL ASSEMBLY

[75] Inventors: Debaprosad Dutt, Whitehall, Pa.; Chi-Yuan Lo, Basking Ridge, N.J.

[73] Assignee: AT&T Bell Laboratories, Murray Hill, N.J.

[21] Appl. No.: 752,292

[22] Filed: Aug. 30, 1991

[51] Int. Cl.$^5$ .............................................. G03C 5/00
[52] U.S. Cl. ............................................ 430/5; 430/311; 430/319; 430/320
[58] Field of Search .................... 430/5, 311, 319, 320

[56] References Cited

PUBLICATIONS

28th ACM/IEEE Design Automation Conferences; Tsay et al.; paper 37.2; "An Analytical Net Weighing Approach for Performance Optimization in Circuit Placement"; 1991.
28th ACM/IEEE Design Automation Conferences; Harrison; paper 41.4; "VLSI Layout Compaction Using Radix Priority Search Trees"; 1991.
28th ACM/IEEE Design Automation Conferences; Dutt et al.; paper 41.5; "On Minimal Closure Constraint Geneation for Symbolic Cell Assembly"; 1991.
IEEE International Conference on Computer-Aided Design; Reichelt et al., pp. 482-485; "An Improved Cell Model for Hierarchial Constraint-Graph Compaction"; 1986.

*Primary Examiner*—Marion E. McCamish
*Assistant Examiner*—Mark A. Chapman
*Attorney, Agent, or Firm*—Richard D. Laumann

[57] ABSTRACT

A method is described which reduces the size of the constraint graph used in assembling cells into a tiled module for integrated circuit manufacture. The smaller size significantly reduces the amount of time required to assemble the cells appropriately.

9 Claims, 1 Drawing Sheet

METHOD OF INTEGRATED CIRCUIT MANUFACTURING INCLUDING CELL ASSEMBLY

TECHNICAL FIELD

This invention relates to a method of cell assembly useful in semiconductor integrated circuit manufacture and to using the cell assembly in integrated circuit manufacture.

BACKGROUND OF THE INVENTION

Integrated circuits are typically formed from many small building blocks which are typically termed cells. Efficient manufacture of the integrated circuit requires that the individual cells be designed so that, other factors being equal, surface area in minimized. Of course, the integrated circuit is formed from many cells and the cells, which need not have the same size, have to be arranged suitably with respect to each other. This arrangement has to be performed for memories, processors, application specific, digital signal processing, etc., integrated circuits.

Several techniques have been developed to assemble the individual cells. In one technique, the cells are stretched so that they pitch-match and are then assembled to form what is termed a tiled module. Although it would seem that this procedure uses space that could otherwise be usefully employed, it has been found that, especially for custom VLSI, the seemingly lost space is difficult to usefully employ. The cells must then be electrically connected to each other using the vertices, frequently termed ports, at the boundaries of the cells. There is no need for any knowledge of the internal structure of the cell for this step; only the port vertices need be known. However, for the cells to be stretchable, constraints between every pair of port vertices must be derived. The derived constraint set is called the closure constraints. A constraint refers to an inequality relation between two vertices (variables) $v_i + w_{ij} \leq v_j$ where $w_{ij}$ can be either positive or negative. If the cells have p ports, it has been found that the number of constraints is roughly proportional to $p^2$. For cells with large number of ports, it becomes very difficult to satisfy all of the constraints in a reasonable time.

Accordingly, methods for reducing the number of constraints, i.e., the size of the closure constraint graph or set, have been sought. One method was reported by Reichelt, "An Improved Cell Model for Hierarchical Layout Compaction," MIT Master's thesis, 1987. This method relies on the realization that, for a given longest path, any subpath within the path is also a longest path. The problem of finding the longest path is functionally equivalent to the well known problem of finding the shortest path. Thus, if there is a longest path from $x_i$ to $x_j$ which goes through $x_k$, the arc from $x_i$ to $x_j$ is redundant. This method, termed event cancellation, eliminates some redundant constraints, is advantageously employed in many situations. However, it has been found that it is ineffective in some situations, such as the situation in which there are multiple longest paths reaching a common vertex but having unequal numbers of edges. Our experience has been that these conditions constitute the majority of redundant constraints.

SUMMARY OF THE INVENTION

A method of integral circuit manufacture forms a tiled module of cells by stretching and pitch matching the cells according to a closure constraint graph, eliminating redundant edges by generating longest path trees at each vertex, examining the graph for disjoint alternative paths and deleting edges if they are not in the longest path. The module is used to form a mask which is then used in integrated circuit manufacture. In another embodiment of the invention, a tiled module of cells is formed by stretching and pitch matching cells according to a closure constraint graph, eliminating redundant edges by generating longest path trees at each vertex, examining the graph for disjoint alternative paths, and deleting edges if they are not in the longest path. The module is used to form a mask useful in integrated circuit manufacture. In yet another embodiment of the invention, a tiled module of cells is formed by stretching and pitch matching cells according to a closure constraint graph, eliminating redundant edges by generating longest path trees at each vertex, examining the graph for disjoint alternative paths, and deleting edges if they are not in the longest paths.

In yet another embodiment of the invention, the generation of the closure constraint graph is interleaved with the elimination of redundant edges. In still another embodiment of the invention, the vertices for the elimination of redundant edges are selected in reverse topological order.

DETAILED DESCRIPTION

Figure 1:
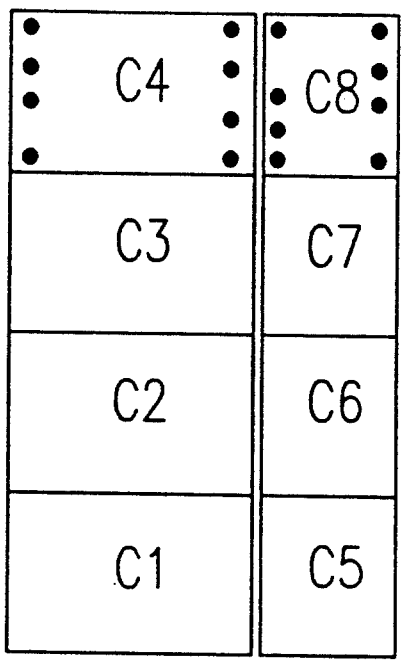
FIG. 1 is a schematic representation of pitch matched cells arranged in a tiled module.

The layout of the individual cells which form integrated circuits according to this invention will be readily accomplished by those skilled in the art and no detailed description need be given. FIG. 1 shows an idealized integrated circuit according to this invention. The circuit has eight individual cells, represented as C1, C2, ..., C8. Each cell has a plurality of ports which are located at or near the cell periphery. The ports are schematically indicated by dots for cells C4 and C8. It will be readily appreciated that a typical integrated circuit has many more individual cells and ports than are depicted, but the limited number of cells and ports depicted are sufficient to explain the invention so that one skilled in the art can understand and practice the invention.

The size of the closure constraint graph used when the cells are stretched and pitch matched is reduced by a method that rapidly finds and eliminates the redundant edges of the closure constraint graph used in assembling the individual cells into a tiled module. The method iterates among the vertices of the closure graph. For ease of exposition, we assume that a closure constraint graph is given here. Such a closure constraint graph can be obtained by iterating on every vertex in the cell constraint graph by a standard longest path algorithm. Those skilled in the art will readily obtain the graph. Beginning at the $v_i$ vertex, the longest path tree $T_i$ is generated with $v_i$ as the source. Only the fan out edges from the source vertex are considered. A constraint is redundant if there is a disjoint alternative path from $v_i$ to $v_j$ whose path length is greater than or equal to $w_{ij}$. Thus, an edge can be deleted immediately if it is not in the longest path.

More particularly, the longest path tree at $v_i$ is generated. The tree can be obtained by determining the longest path. A constraint is termed tight if $u_k + w_{kj} = u_j$, where $u_k$ and $u_j$ denote the longest path lengths from the source vertex to $v_k$ and $v_j$, respectively. In other words, the constraint is satisfied by equality, so an edge is eliminated if it is not in the longest path tree. The tree $T_i$ is further partitioned into subtrees $T_{ij}$ rooted at $v_j$. The vertices of each subtree form a subset. The identifier for a set is shown as id. For each candidate edge, the fan-in constraint set is examined for possible second longest paths of equal length to $v_j$. The equal length condition is verified by checking if $e_{kj}$ is tight. The second longest path is disjoint from $e_{ij}$ if the id of the subtree is not $v_j$. The sets are updated when the edge $e_{ij}$ is deleted.

Figure 2:
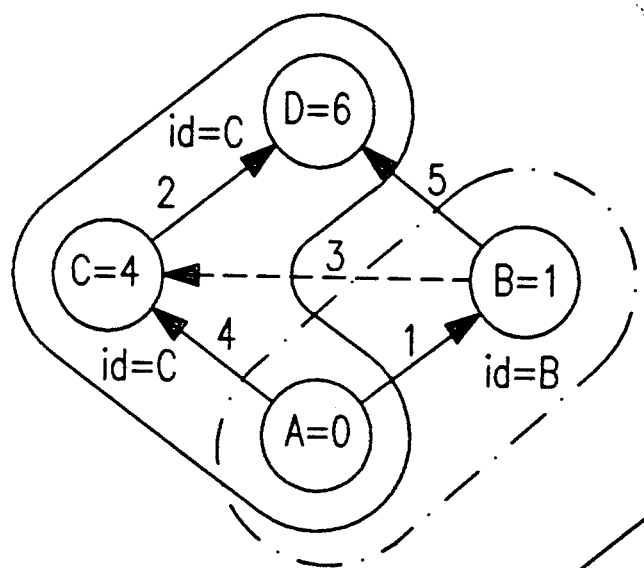
FIGS. 2-3 are useful in explaining how redundant edges in the constraint graph are eliminated.
Figure 3:
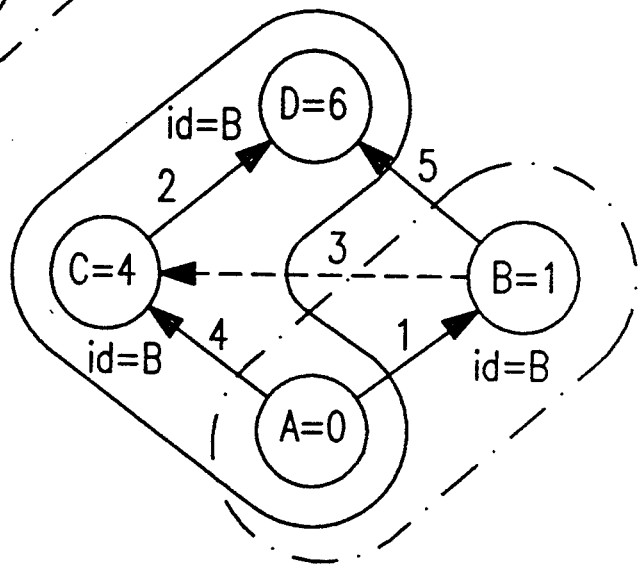

FIG. 2 illustrates the method as applied to a cell with four vertices which are indicated as A, B, C, and D. Distances from A are indicated. The ids of the trees are indicated. A will be treated as the source vertex and the tree $T_a$ is shown as are the subtrees $T_{ac}$ and $T_{ab}$ which are indicated by the solid and dashed lines respectively. $T_a$ is the longest path tree beginning at vertex A. The two subtrees have the nodes C and D, and B, respectively. The fan in edge BC is tight and the alternate path from A to C through B is disjoint from AC. Therefore, the edge AC is disjoint and is deleted. However, in FIG. 3, the subtree $T_{ac}$ joins, i.e., is merged with $T_{ab}$ and the invariant is maintained.

The method may be termed gready because the redundant edges are discovered first by the order of the source vertex and second by the order in which the fan out candidates are formed. By this method, more redundant edges are removed than were removed with event cancellation. In fact, the size of the closure graph is of the order of the number of ports p, rather than of the order of $p^2$ as it was for event cancellation. For an exemplary cell with 1204 ports, the sizes of the closure graph for event cancellation and our method are 168708 and 8117, respectively. The size of the graph has thus been reduced by a factor of approximately 20.

The method as described assumes a given closure constraint graph, which has a very large number of constraints, e.g., 168,708. The generation of a large number of constraints can be reduced by incorporating the reduction process into the closure generation process. In other words, the process of generating the closure constraint graph is interleaved with the process of eliminating redundant edges. This interleaving will be readily done by those skilled in the art. For an exemplary cell with 1255 ports, it was found that the final size of the closure graph was 3140 but that the peak number of constraints was 7523 compared to the much longer original number of approximately 200,000. This method greatly reduces the amount of memory required.

The reduction of the temporary peak requires appropriate ordering of the ports during the iteration. The order used is the reverse topological order relative to the floor vertex in the cell graph where only the arcs of positive weight are present. The term reverse topological order is well known to those skilled in the art and need not be further discussed.

After the cells, which include transistors, contacts, interconnections, etc., have been arranged in the desired tiled module, the structure in the module is transferred into a mask suitable for pattern replication. The finished mask usually comprises a patterned metal, such as chromium, on a glass substrate. Suitable and well known techniques are used to transfer the structure into the mask. For example, the entire glass substrate is coated with a metal and a resist is deposited on the metal. Portions of the resist are then selectively exposed to radiation, such as an electron beam, to form the desired pattern in the resist. The pattern is then transferred from the resist to the metal by appropriate resist development and metal etching techniques.

Fabrication of exemplary integrated circuits will typically require a plurality of such masks with different patterns. Integrated circuit fabrication techniques are well known to those skilled in the art and need not be described in detail. Each mask pattern is replicated on the wafer with a technique generally similar to that described for mask fabrication, i.e., the wafer is coated with a resist and then selected portions of the resist are exposed to radiation through the mask. Development of the resist so that selected portions of the material underlying the resist are exposed follows, and the exposed portion modified by etching, ion implantation, etc., to complete the fabrication sequence.

Variations in the embodiment described will be readily apparent to those skilled in the art.

We claim:

1. A method of integrated circuit manufacture comprising:
   forming a tiled module of a plurality of cells, by stretching and pitch matching said cells according to a closure constraint graph, eliminating redundant edges by generating longest path trees at each vertex of said graph, examining the graph for disjoint alternative paths, and deleting edges if they are not in the longest path;
   fabricating a mask for said module; and
   using said mask to fabricate a level in said integrated circuit.

2. A method as recited in claim 1 in which said vertices are selected in reverse topological order.

3. A method as recited in claim 2 comprising the further step of generating said closure constraint graph, said generating step being interleaved with said eliminating step.

4. A method of semiconductor integrated circuit mask manufacture:
   forming a tiled module of a plurality of cells by stretching and pitch matching said cells according to a closure constraint graph, eliminating redundant edges by generating longest path trees at each vertex of said graph and examining the graph for disjoint alternative paths, and deleting edges if they are not in the longest path; and
   fabricating a mask for said module.

5. A method as recited in claim 4 in which said vertices are selected in reverse topological order.

6. A method as recited in claim 5 comprising the further step of generating said closure constraint graph, said generating step being interleaved with said eliminating step.

7. A method of arranging a plurality of cells to form an integrated circuit, by stretching and pitch matching said cells according to a closure constraint graph, eliminating redundant edges by generating longest path trees at each vertex of said graph, examining the graph for disjoint alternative paths and deleting edges if they are not in the longest path.

8. A method as recited in claim 7 in which said vertices are selected in reverse topological order.

9. A method as recited in claim 8 comprising the further step of generating said closure constraint graph, said generating step being interleaved with said eliminating step.

* * * * *